(12) United States Patent
Wang et al.

(10) Patent No.: US 10,677,852 B1
(45) Date of Patent: Jun. 9, 2020

(54) DETERMINING BATTERY CAPACITY (71) Applicant: Amazon Technologies, Inc., Seattle, WA (US)

(72) Inventors: Ligong Wang, Austin, TX (US); Darin Lee Frink, Lake Tapps, WA (US)

(73) Assignee: Amazon Technologies, Inc., Seattle, WA (US)

(*) Notice: Subject to any disclaimer, the term of this patent is extended or adjusted under 35 U.S.C. 154(b) by 255 days.

(21) Appl. No.: 15/806,204

(22) Filed: Nov. 7, 2017

(51) Int. Cl.
| | |
|---|---|
| *G01N 27/416* | (2006.01) |
| *G01R 31/40* | (2020.01) |
| *G01R 31/388* | (2019.01) |
| *G01R 31/36* | (2020.01) |

(52) U.S. Cl.
CPC ....... *G01R 31/388* (2019.01); *G01R 31/3647* (2019.01); *G01R 31/3648* (2013.01)

(58) Field of Classification Search
CPC ............ G01R 31/3606; G01R 31/3648; G01R 31/3693; G01R 31/382; G01R 31/3647; H02J 7/007; H02J 7/0052; H02J 7/04; H02J 7/0063; H02J 7/0047; H01M 10/44; H01M 10/46; H01M 10/0525; H01M 10/54; H01M 10/052; H01M 10/48
See application file for complete search history.

(56) References Cited

U.S. PATENT DOCUMENTS

| | | | | |
|---|---|---|---|---|
| 5,592,094 A | * | 1/1997 | Ichikawa | ............... H01M 10/44 324/427 |
| 5,616,968 A | * | 4/1997 | Fujii | ........................ H02J 3/38 307/150 |
| 2008/0164762 A1 | * | 7/2008 | Pecile | .................... H02J 7/0031 307/66 |
| 2009/0218989 A1 | | 9/2009 | Davis | |
| 2014/0239964 A1 | * | 8/2014 | Gach | ...................... H02J 7/0021 324/433 |
| 2015/0067362 A1 | * | 3/2015 | Sultenfuss | ............ G06F 1/3296 713/320 |
| 2015/0377971 A1 | * | 12/2015 | Keating | ................ H02J 7/0047 307/130 |
| 2016/0028254 A1 | * | 1/2016 | Honoki | ................. H01M 10/44 320/162 |
| 2016/0266979 A1 | | 9/2016 | Glover et al. | |
| 2016/0372935 A1 | | 12/2016 | Sakata et al. | |
| 2017/0057650 A1 | * | 3/2017 | Walter-Robinson | ......................... B64D 41/00 |

OTHER PUBLICATIONS

U.S. Appl. No. 15/810,582, filed Nov. 13, 2017, Titled: Calibrating Battery Fuel Gages.

* cited by examiner

Primary Examiner — Minh N Tang
(74) Attorney, Agent, or Firm — Kilpatrick Townsend & Stockton LLP (57) ABSTRACT

Methods and related systems conduct a capacity check of a battery via a partial discharge cycle. A method of estimating a total capacity of a battery includes partially discharging the battery at a controlled discharge rate so as to discharge an amount of energy from the battery over a period of time. An output voltage of the battery is measured during the period of time. A total capacity of the battery is estimated based on the amount of energy discharged from the battery during the partial discharge cycle and the output voltage of the battery measured during the partial discharge cycle.

19 Claims, 6 Drawing Sheets

DETERMINING BATTERY CAPACITY

BACKGROUND

Many critical electrically powered systems include one or more backup battery units that provide backup power to the system in the event of a loss of utility power. Backup battery units, however, can fail latently, and therefore may not be capable of providing adequate backup power to the system in the event of loss of utility power. While the capacity of a backup battery unit can be periodically checked by measuring the total amount of power discharged by the backup battery unit from a full charge level to an empty charge level, in the event of loss of utility power while the backup battery unit is at the empty charge level the backup battery unit would have no power to provide to the system.

BRIEF DESCRIPTION OF THE DRAWINGS

Various embodiments in accordance with the present disclosure will be described with reference to the drawings, in which.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Systems and methods described herein provide detection of latent failure of a backup battery unit by assessing output characteristics of the backup battery unit during a partial discharge cycle of the backup battery unit. By employing a partial discharge cycle instead of a full discharge cycle, the backup battery unit can provide a significant amount of energy in the event of loss of AC power during all portions of the partial discharge cycle. In contrast, if a full discharge cycle is used to check for latent failure of the backup battery unit, the backup battery unit cannot provide a significant amount of energy in the event of loss of AC power when the backup battery unit has a zero or otherwise inadequate charge level.

In many embodiments, systems and methods described herein employ a partial discharge cycle of the battery backup unit in which the battery backup unit outputs direct current (DC) power at a controlled rate (e.g., at a constant rate). In many embodiments, the controlled rate DC power output by the backup battery unit during the partial discharge cycle is combined with variable power originating from an AC power source and the resulting varying DC power is supplied to a regular system load. By discharging the backup battery unit at a controlled rate during the partial discharge cycle, the amount of energy extracted from the battery backup unit during the partial discharge cycle can be more accurately determined as compared to if the battery backup unit is partially discharged at an uncontrolled rate corresponding to the power drawn by the system load.

In many embodiments, systems and methods described herein employ a partial discharge cycle in which the energy withdrawn from the backup battery unit is supplied to a regular system load. As a result, the energy extracted from the backup battery unit is consumed by the regular system load as opposed to being converted into waste heat energy as would be the case if the energy extracted is supplied to one or more resistors.

Figure 1:
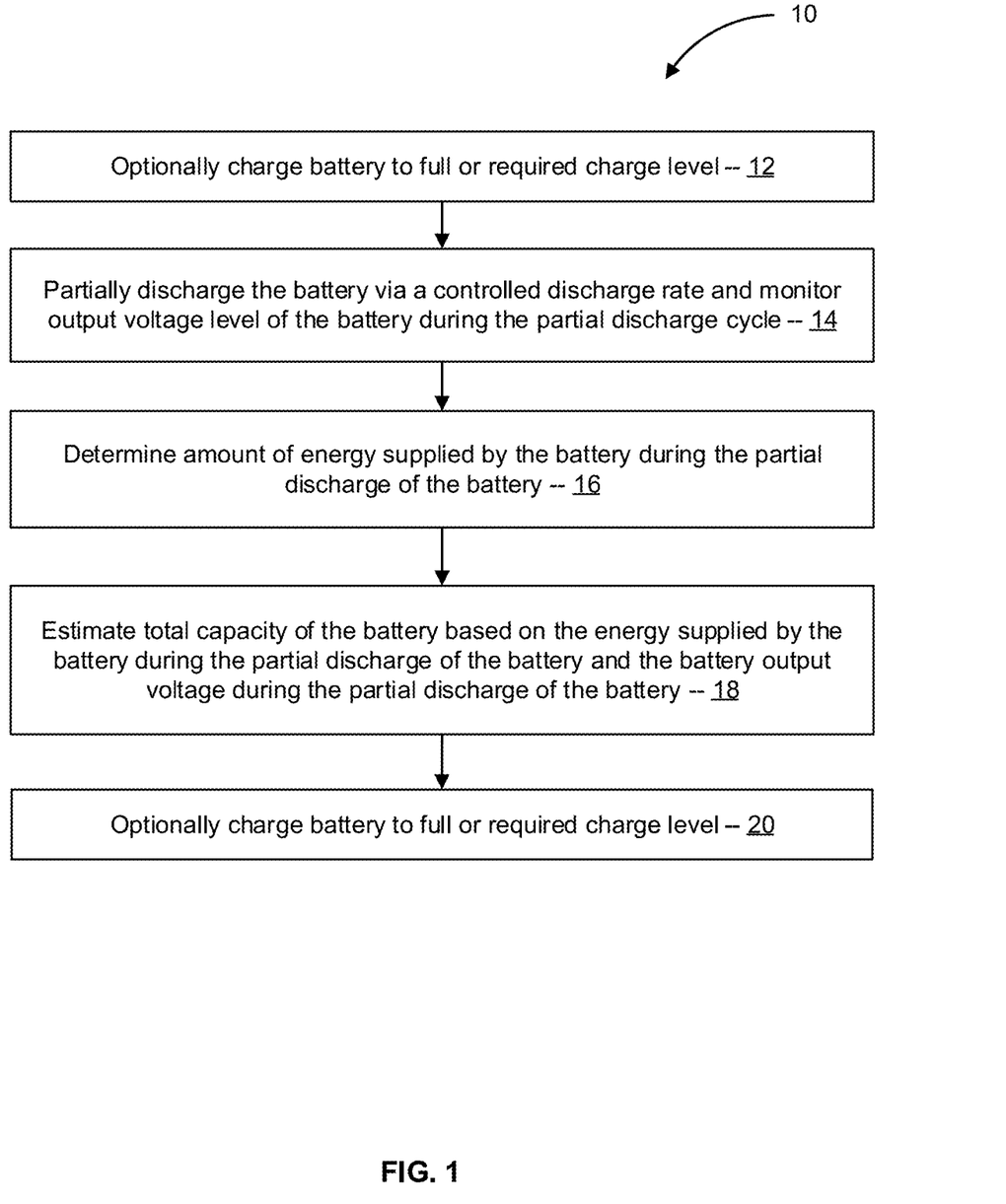
FIG. 1 is a simplified schematic diagram of acts of a method of estimating total capacity of a battery based on output of the battery during a partial discharge cycle, in accordance with some embodiments.

Turning now to the drawings in which like reference indicators refer to like elements in the various figures, FIG. 1 is a simplified schematic diagram of acts of a method 10 of estimating total capacity of a battery based on output of the battery during a partial discharge cycle, in accordance with some embodiments. Some or all of the method 10 (or any other methods described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

The method 10 includes subjecting the battery to a partial discharge cycle and estimating total capacity of the battery based on the amount of energy discharged from the battery and the battery voltage during the partial discharge cycle. The method 10 can optionally include charging the battery to a full charge level prior to subjecting the battery to a partial discharge cycle (act 12). Act 12 can be omitted if the battery already has a sufficient charge level.

In act 14, the battery is partially discharged at a controlled discharge rate. For example, the battery can be discharged at a constant power rate (e.g., 1.5 KW), thereby simplifying determination of the total amount of energy discharged from the battery during the partial discharge cycle by avoiding having to accurately account for short-cycle variability in the rate at which power is discharged from the battery that may exist absent controlling the discharge rate. In some embodiments, as described in more detail below, the power extracted from the battery at the controlled discharge rate is supplemented with variable rate power so as to supply a variable rate power drawn by a regular system load. The magnitude of the partial discharge of the battery can be any suitable fraction of the total capacity of the battery as described herein.

In act 16, the amount of energy supplied by the battery during the partial discharge of the battery is determined. For example, when the battery is discharged at a constant power rate, the amount of energy supplied is the constant power rate multiplied by the time period over which the constant power rate is discharged. In some embodiments, the battery includes a battery management unit that monitors the amount of energy supplied by the battery during the partial discharge of the battery.

Figure 2:
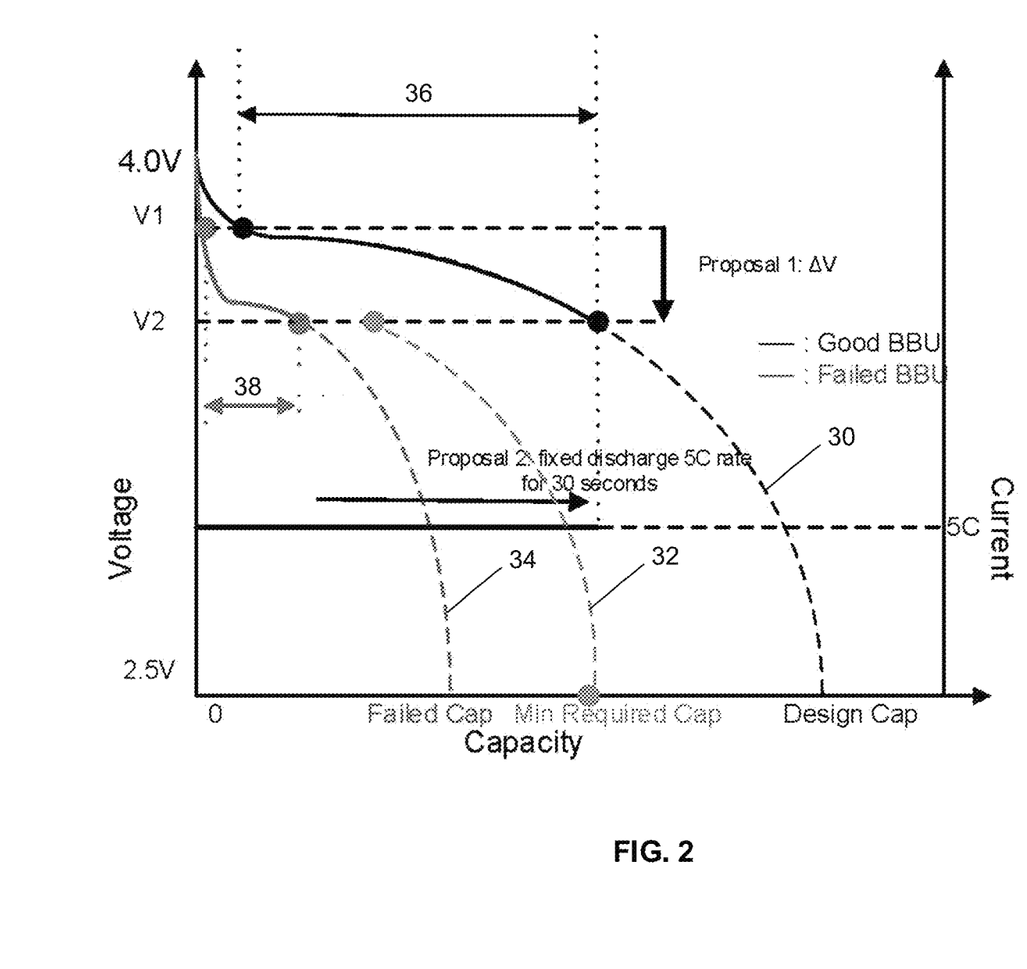
FIG. 2 is a graph illustrating discharge characteristics of a backup battery unit having different total capacities, in accordance with some embodiments.

In act 18, the total capacity of the battery is estimated based on the energy supplied by the battery during the partial discharge cycle and the battery output voltage during the partial discharge of the battery. For example, FIG. 2 is a graph illustrating discharge characteristics of a backup battery unit having different total capacities, in accordance with some embodiments. In FIG. 2, the output voltage during a full discharge cycle is shown for different instances of a battery configuration having different total capacities due to applicable characteristics (age, cycle history, manufacturing induced differences, etc.) of the particular instance of the battery. For example, output voltage curve 30 corresponds to a representative instance of the battery configuration having a total capacity equal to the design capacity of the battery configuration. Output voltage curve 32 corresponds to a representative instance of the battery configuration having a total capacity equal to a minimum required capacity (e.g., to meet minimum system requirements) of the battery configuration. Output voltage curve 34 corresponds to a representative instance of the battery configuration having a total capacity below the minimum required capacity of the battery configuration.

In act 18, the total capacity of the battery is estimated based on the energy supplied during the partial discharge cycle. Any suitable partial discharge cycle can be employed. For example, the partial discharge cycle can be terminated when the output voltage of the battery drops to a predetermined voltage. As shown in FIG. 2, the energy output by the battery during the partial discharge cycle from an output voltage of the battery equal to a first voltage level (e.g., V1 shown in FIG. 2) and an output voltage of the battery equal to a second voltage level (e.g., V2 shown in FIG. 2) can be measured and used to estimate total capacity of the battery. In some embodiments, the partial discharge cycle is terminated when the output voltage of the battery drops to V2. For example, as illustrated in FIG. 2, for output voltage curve 30 (corresponding to a total capacity equal to the design capacity of the battery configuration), the energy discharged by the battery during the partial discharge cycle between output voltages V1 and V2 is shown by measured output energy 36. As another example, as illustrated in FIG. 2, for output voltage curve 34 (corresponding to a total capacity of a failed instance of the battery configuration), the energy discharged by the battery during the partial discharge cycle between output voltages V1 and V2 is shown by measured output energy 38. Accordingly, if the measured output energy during the partial discharge cycle between output voltages V1 and V2 is equal or greater than an output energy amount corresponding to the output voltage curve 32 (i.e., the minimum required capacity), the battery can be identified as having a total capacity equal to or greater than the minimum required capacity. In some embodiments, the total capacity can be estimated based on the measured energy discharged by the battery during the partial discharge cycle between output voltages V1 and V2. For example, a lookup table having suitable estimates for total capacity for each of a suitable number of measured output energy during the partial discharge cycle between output voltage V1 and V2 can be stored in memory and used to determine a suitable estimate of total capacity corresponding to any measured output energy using a suitable approach (e.g., interpolation). Any suitable values of voltage V1 and voltage V2 can be employed. For example, V1 and V2 can be selected so that the measured energy output during the partial discharge cycle is less than a suitable portion (e.g., 50%, 25%, 10%) of the estimated total capacity of the battery.

In other embodiments, the partial discharge cycle discharges power from the battery at a fixed rate for a fixed period of time after the output voltage of the battery drops to V1. The output voltage at the end of the partial discharge cycle can then be measured and used to estimate total capacity of the battery. For example, as shown in FIG. 2, if the partial discharge cycle discharges energy amount 36 from the battery after the output voltage of the battery drops to V1 and the output voltage at the end of the partial discharge cycle is measured as being V2, the total capacity of the battery can be estimated to be equal to the design capacity of the battery as indicated by output voltage curve 30. For the embodiment illustrated in FIG. 2, if the output voltage at the end of the partial discharge cycle is measured as being 2.5 V or less, the total capacity of the battery can be estimated as being less than the minimum required capacity of the batter as indicated by output voltage curves 32, 34. Accordingly, the total capacity of the battery can be estimated based on the output voltage at the end of the partial discharge cycle. For example, a lookup table having suitable estimates for total capacity for each of a suitable number of measured output voltage at the end of the partial discharge cycle from output voltage V1 can be stored in memory and used to determine a suitable estimate of total capacity corresponding to any measured output voltage at the end of the partial discharge cycle using a suitable approach (e.g., interpolation). The lookup table can be generated using any suitable approach, including monitoring voltage characteristics of each of a plurality of batteries during a suitable initial portion of a full discharge cycle of the battery and correlating the energy output and voltage characteristics for the battery during the initial (i.e., partial discharge) portion of the full discharge cycle with the total amount of energy output during the full discharge cycle of the battery. Any suitable values of voltage V1 and amount of energy discharged during the partial discharge cycle can be employed. For example, V1 and the amount of energy discharged during the partial discharge cycle can be selected so that the amount of energy discharged is less than a suitable portion (e.g., 50%, 25%, 10%) of the estimated total capacity of the battery.

Figure 3:
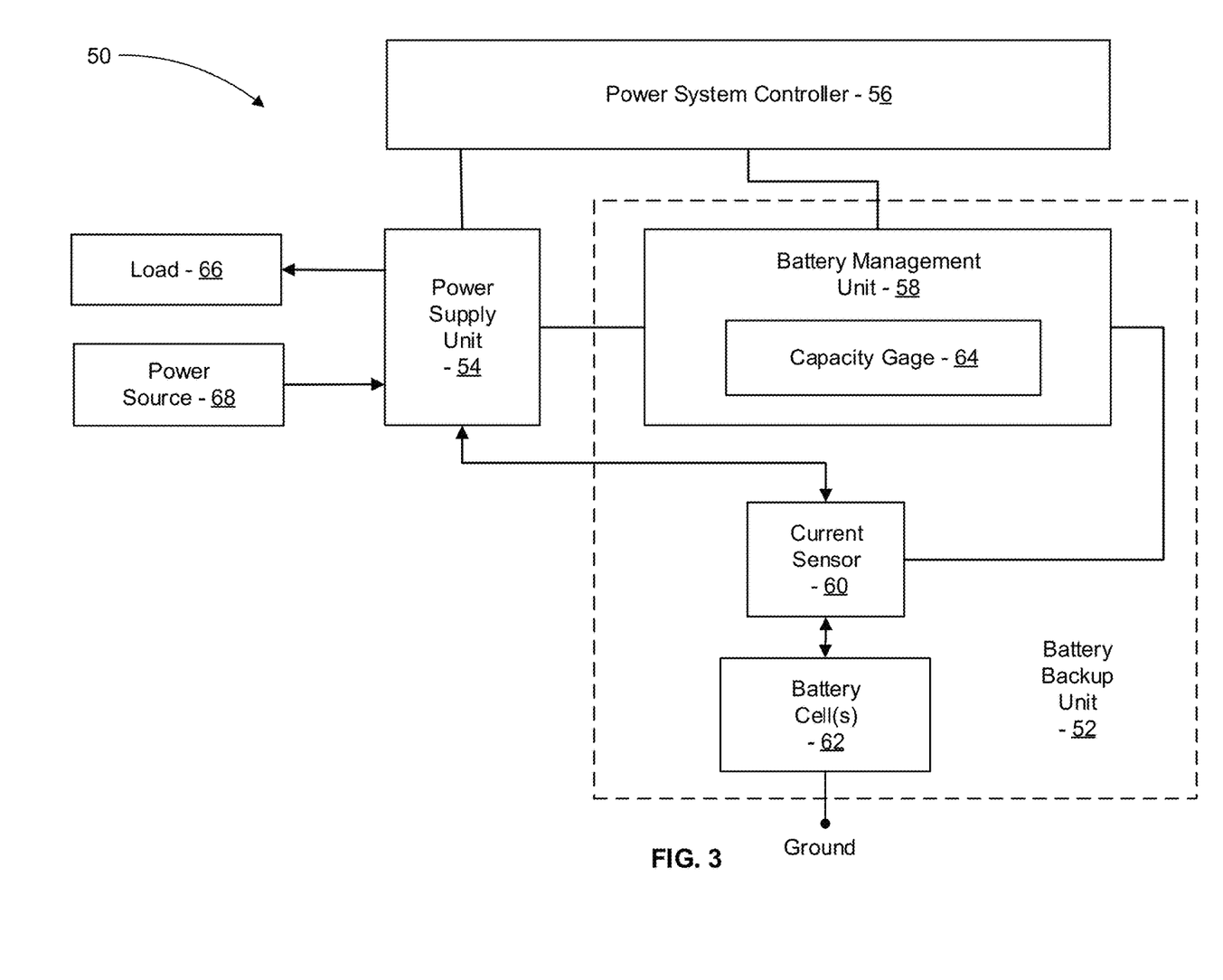
FIG. 3 is a simplified schematic diagram of a power supply system including a power system controller and a backup battery unit that includes a battery management unit with a capacity gage, in accordance with some embodiments.

FIG. 3 is a simplified schematic diagram of a power supply system 50, in accordance with some embodiments. The power supply system 50 includes a backup battery unit 52, a power supply unit 54, and a power system controller 56. The backup battery unit 52 includes a battery management unit 58, a current sensor 60, and one or more battery cells 62. The battery management unit 58 includes a capacity gage 64 that stores an estimate of the amount of energy that can be discharged from the battery cell(s) 62 from the current state of charge of the battery cell(s) 62 to a lower state of charge (e.g., a state of charge below which the battery management unit 58 blocks further discharge of the battery cell(s) 62 to prevent an undesirable under-voltage condition). The capacity gage 64 can have any suitable configuration. For example, the battery management unit 58 can include one or more processor and a memory device that stores capacity data indicating the estimate of the amount of energy that can be discharged from the battery cell(s) 62 from the current state of charge of the battery cell(s) 62 to the lower state of charge.

In many embodiments, the power supply unit 54 is operable to supply electrical power (e.g., direct current (DC) power, alternating current (AC) power) to a load 66 at a rate (e.g., variable, constant) drawn by the load 66. The power supply unit 54 is operable to generate the electrical power supplied to the load 66 from electrical power (e.g., DC power, AC power) supplied to the power supply unit 54 by a power source 68. In the event that the power source 68 is incapable of supplying adequate electrical power to the power supply unit 54 to satisfy the power requirements of the load 66 (e.g., when the power source 68 is a utility power source that is experiencing a temporary outage), the power supply unit 54 is operable to draw DC power from the backup battery unit 52 and generate the electrical power supplied to the load 66 from the DC power drawn from the backup battery unit 52.

In many embodiments, the power supply unit 54 is operable to supply DC power to the backup battery unit 52 to charge the battery cell(s) 62. For example, in many embodiments, when the power source 68 is capable of supplying adequate electrical power to the power supply unit 54, the power supply unit 54 can simultaneously supply electrical power to the load 66 and DC power to the backup battery unit 52 to charge the battery cell(s) 62 to a predetermined high charge level (e.g., a full charge level for the backup battery unit 52).

In many embodiments, the capacity gage 64 is continually updated based on the amount of current flowing into and out of battery cell(s) 62 as sensed by the current sensor 60 and a voltage level of the battery cells(s) 62. For example, during discharge of energy from the battery cell(s) 62 to the power supply unit 54, the current flowing from the battery cell(s) is sensed by the current sensor 60, which transmits a signal to the battery management unit 58 indicative of the magnitude of the current flowing from the battery cell(s) 62. The battery management unit 58 processes the signal from the current sensor 60 in combination with a voltage of the battery cell(s) 62 and elapsed time to measure energy discharged from the battery cell(s) 62. The battery management unit 58 repeatedly updates the capacity gage 64 to reflect the amount of energy discharged from the battery cell(s) 62. During charging of the battery cells(s) 62, the battery management unit 58 processes the signal from the current sensor 60 in combination with a voltage of the battery cell(s) 62 and elapsed time to measure the energy charged into the battery cell(s) 62. The battery management unit 58 repeatedly updates the capacity gage 64 to reflect the amount of energy charged into the battery cell(s) 62.

Figure 4:
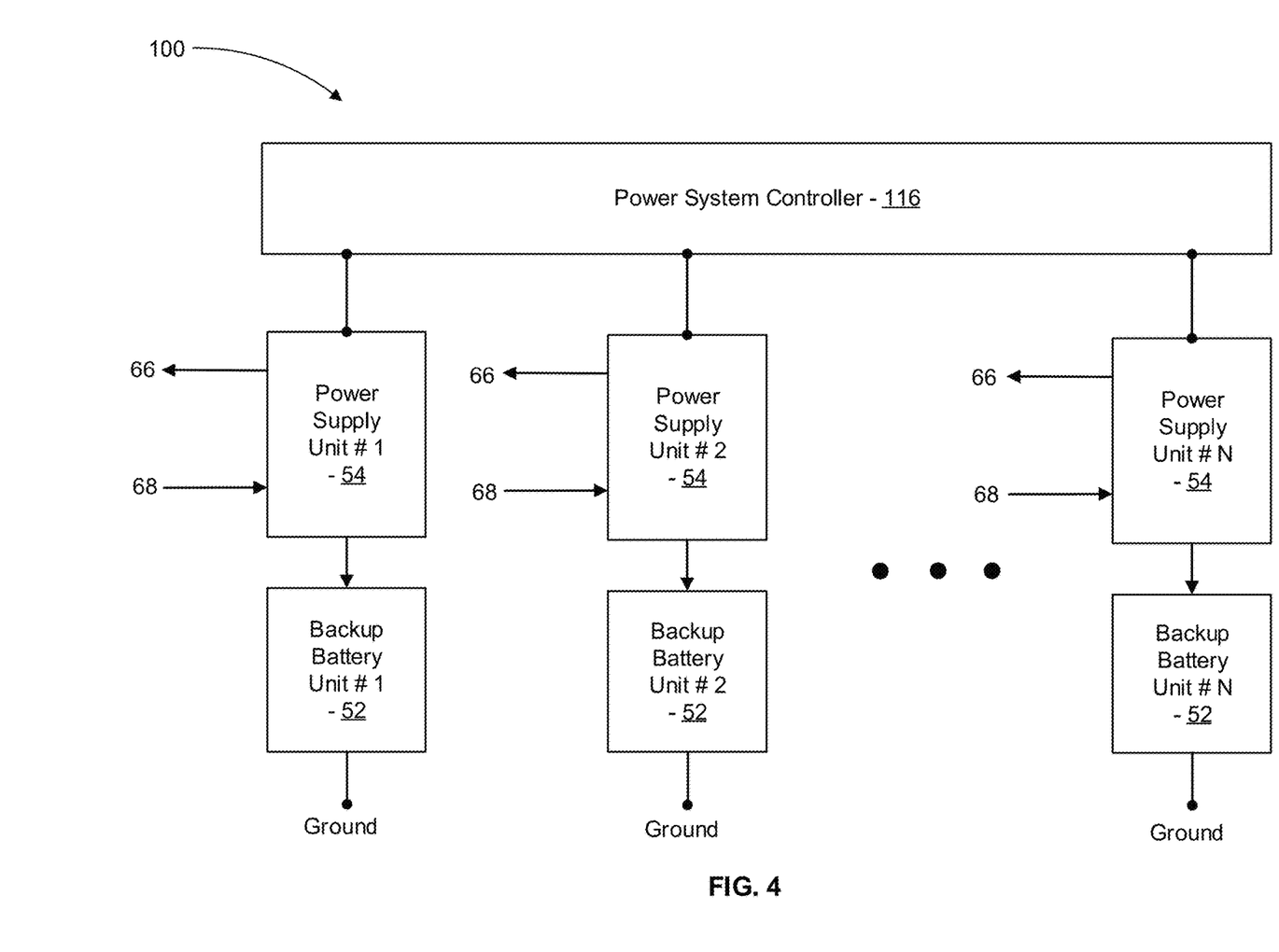
FIG. 4 is a simplified schematic diagram of a power supply system including a power system controller and backup battery units, each of the backup battery units including a battery management unit with a capacity gage, in accordance with some embodiments.

FIG. 4 is a simplified schematic diagram of a power supply system 100, in accordance with some embodiments. The power supply system 100 is similar to the power supply system 50, but includes multiple pairs of a respective power supply unit 54 and a respective backup battery unit 52. Any suitable number of pairs of the power supply unit 54 and the backup battery unit 52 can be included in the power supply system 100.

In some embodiments, the power supply system 100 is configured to be mounted in a shelf of a server rack and operatively coupled with DC bus bars of the server rack to supply DC power to system loads mounted in the server rack. The power supply system 100 includes a power system controller 116 that is configured similar to the power system controller 56 of the power supply system 50 with the power system controller 116 being configured to control each of the power supply units 54 included in the power supply system 100. The power system controller 116 is communicatively coupled with each of the power supply units 54 to conduct the partial discharge cycle capacity check as described herein to estimate total capacity of each of the backup battery units 52.

In some embodiments, the backup battery units 52 temporarily supply DC power to the power supply units 54 for use by the power supply units 54 to produce the DC power drawn by the load 66 while a generator is brought on-line when utility power is lost. In an example embodiment that has six total battery backup units 52, each of the backup battery units 52 is configured to have a minimum total capacity sufficient to supply three KW of power for three minutes and five of the battery backup units 52 are sufficient to provide a total design backup battery capacity of 15 KW for three minutes. As a result of having six total backup battery units 52 in the example embodiment, the power supply system 100 has one redundant backup battery unit 52 when all of the six backup battery units have the design minimum total capacity.

To ensure adequate accuracy of the capacity gage 64 of each of the backup battery units 52, each backup battery unit 52 can be periodically subjected to a learning cycle (e.g., every three months) in which the backup battery unit 52 is discharged from a full charge level to an empty charge level and then recharged back to the full charge level. The amount of energy discharged by the backup battery unit 52 during the learning cycle is used to calibrate the capacity gage 64 to accurately reflect the measured capacity of the backup battery unit 52.

During a learning cycle for one of the six backup battery units 52 of the example embodiment of the power supply system 100, however, when the backup battery unit 52 undergoing the learning cycle is at the empty charge level, all five of the other backup battery units 52 are required to meet minimum total design capacity for the backup battery units 52. As a result, in the event of a latent failure in one of the five other backup battery units 52, the power supply system 100 may fail to meet minimum total design capacity for the backup battery units 52 when the backup battery unit 52 undergoing the learning cycle is at the empty charge level. Accordingly, in many embodiments, the power supply system 100 conducts regular partial discharge cycle capacity checks of each of the backup battery units 52 to detect latent failures of the backup battery units 52 and ensure that the backup battery units 52 have sufficient total capacity even when one of the backup battery units 52 is at the empty charge level during a learning cycle used to calibrate the capacity gage of the backup battery unit 52.

In many embodiments, the power system controller 116 controls operation of each of the power supply units 54 to periodically conduct the learning cycle on each of the backup battery units 52 to calibrate the capacity gage 64 of the backup battery unit 52. Any suitable schedule for conducting the learning cycles can be employed. For example, the power system controller 116 can conduct the learning cycle one each of the backup battery units 52 every three months with one of the learning cycles being conducted each half month. Additionally, the power shelf controller 216 can control operation of the power supply units 54 to periodically subject each of the backup battery units to a partial discharge capacity check using any suitable approach described herein to check for latent failures of the backup battery units 52 that could result in insufficient total capacity of the backup battery units 52 relative to minimum design total capacity for the backup battery units 52.

Figure 5:
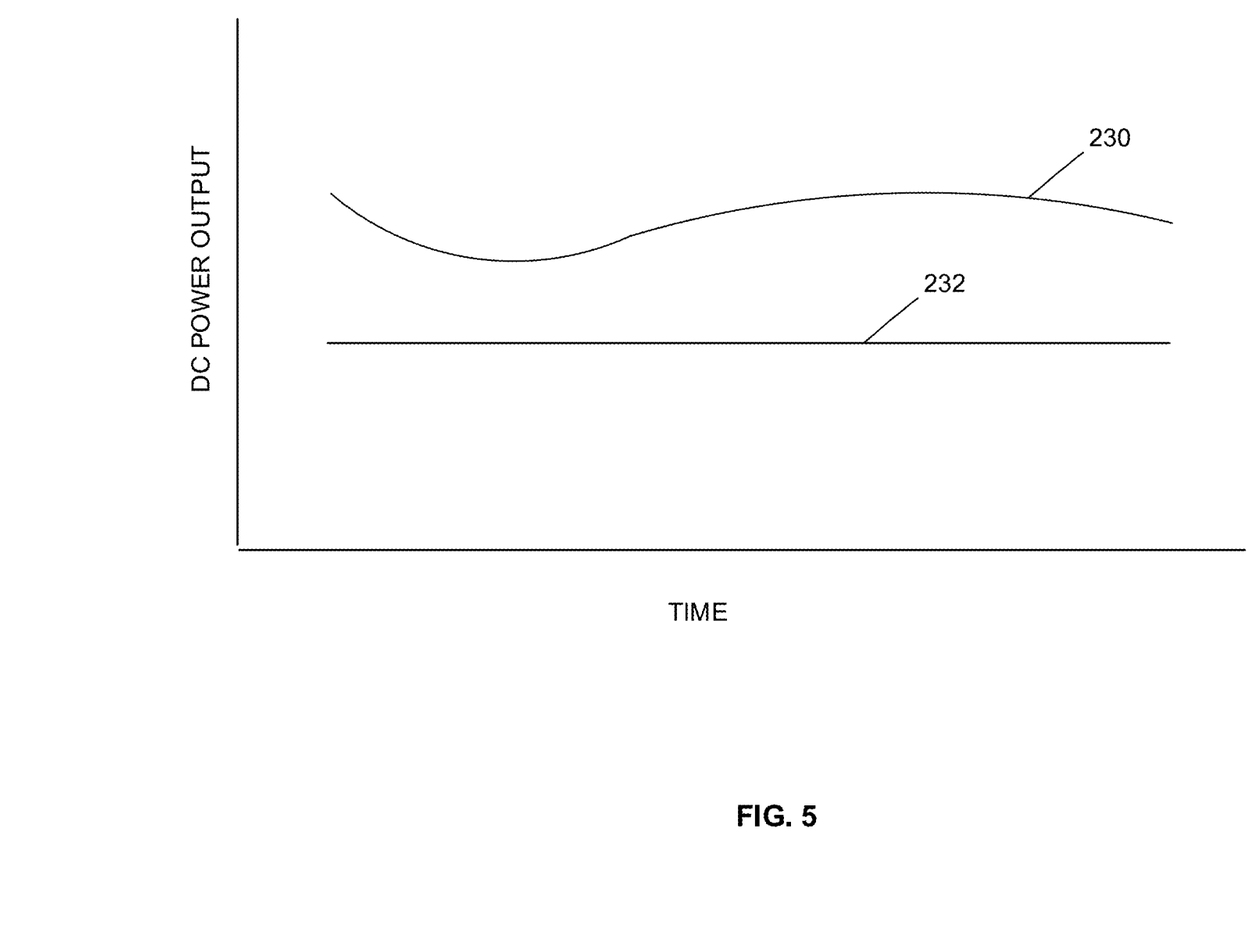
FIG. 5 is a graph illustrating supplying a variable direct current (DC) power to a load and generating the variable DC power via a combination of a constant current DC power draw from a backup battery unit and a variable power draw from an alternating current (AC) power source, in accordance with some embodiments.

FIG. 5 is a graph illustrating supplying a variable direct current (DC) power 230 to the load 66 during the partial discharge cycle capacity check. The variable DC power 230 is generated by the power supply unit 54 from a combination of a constant current DC power 232 drawn by the power supply unit 54 from the backup battery unit 52 and a variable AC power draw from the power source 68, in accordance with some embodiments. In many embodiments, the associated power supply unit 54 draws the constant current DC power 232 from the backup battery unit 52 and draws the variable AC power from the power source 68 so as to generate the variable DC power 230 drawn by the load 66. Accordingly, the backup battery unit 52 is discharged at a controlled rate (e.g., a constant power rate) during the partial discharge capacity check, thereby enabling more accurate measurement of the amount of power discharged by the backup battery unit 52 during the partial discharge capacity check, and enabling better correlation between observed output voltage levels during the capacity check and estimated total capacity due to more consistent level of voltage drops within the backup battery unit 52 associated with internal resistance of the backup battery unit 52.

Figure 6:
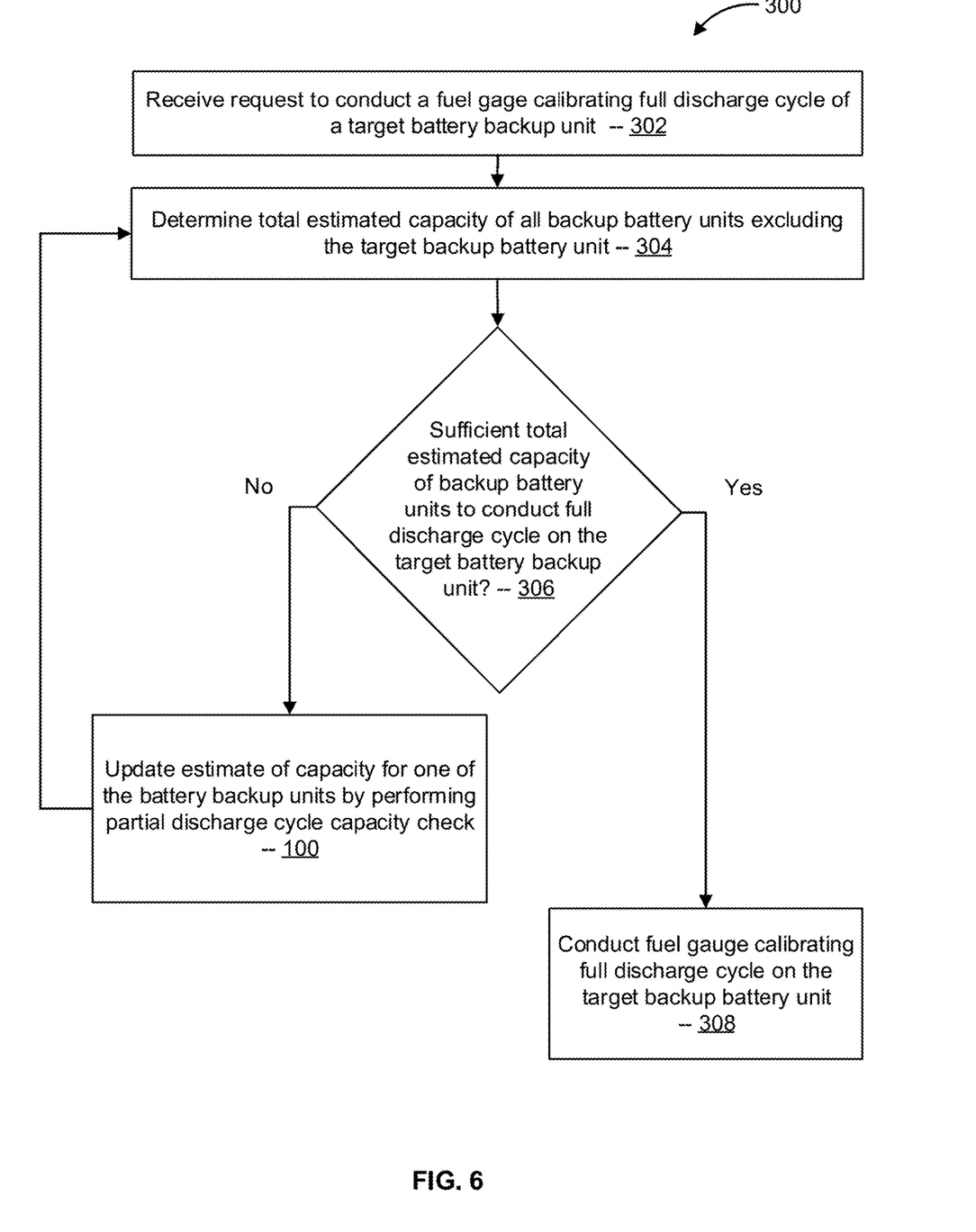
FIG. 6 is a simplified schematic diagram of acts of a method of conducting a capacity gage calibrating full discharge cycle of a target backup battery unit including checking the capacity of other backup battery units to ensure adequate combined capacity of the other backup battery units in the event of loss of utility power while the target backup battery unit has zero or otherwise inadequate charge level, in accordance with some embodiments.

FIG. 6 is a simplified schematic diagram of acts of a method 300 of conducting a capacity gage calibrating full discharge cycle of a target backup battery unit including checking a total estimated capacity of other backup battery units to ensure adequate combined capacity of the other backup battery units in the event of loss of utility power while the target backup battery unit has zero or otherwise inadequate charge level. Some or all of the method 300 (or any other methods described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

In act 302, a request is received to conduct a capacity gage calibrating full discharge cycle of a target battery backup unit of a plurality of battery backup units. The request can be received from any suitable source. For example, each of the battery backup units can include a battery management unit that includes the capacity gage and periodically (e.g., every 2 months) makes the request to calibrate capacity gage to ensure that the capacity gage accurately reflects the actual capacity of the battery. For example, the accumulated effect of leakage current over time can cause the capacity gage to over-estimate the remaining capacity of the battery with the over-estimation error growing as a function of time since the last capacity gage calibrating full discharge cycle of the target battery. The capacity gage calibrating discharge cycle can also be used to detect latent failures of the target battery that result in reduced capacity of the target battery as compared to the capacity indicated by the capacity gage.

In act 304, a total estimated capacity the other battery backup units (i.e., all of the battery backup units excluding the target battery backup unit) is determined. A suitable estimated capacity for each of the battery backup units excluding the target battery backup unit can be employed. For example, in some embodiments, each of the battery backup units includes a battery management unit that includes a capacity gage that tracks a charge level of the battery backup unit by monitoring energy output from and energy input to the battery backup unit. To account for potential of loss of capacity over time due to leakage current, the charge level indicated by the capacity gage can be reduced by a suitable amount based on the amount of time that has passed since the battery backup unit capacity gage was calibrated via a capacity gage calibrating full discharge cycle.

In act 306, the total estimated capacity of the other battery backup units is compared with a minimum required total capacity value to determine if sufficient total estimated capacity exists to conduct the capacity gage calibrating full discharge cycle of the target battery backup unit. If the total estimated capacity of the other battery backup units is sufficient, the capacity gage calibrating full discharge cycle of the target battery backup unit is conducted (act 308).

If the total estimated capacity of the other battery backup units is insufficient, the partial discharge cycle capacity check of method 100 can be conducted on one of the other battery backup units to update the estimated capacity of the selected battery backup unit. For example, one of the other battery backup units having the longest period of time since its last capacity gage calibrating full discharge cycle can be selected to undergo the partial discharge capacity check of method 10 so as to increase the estimate capacity of the battery backup unit by eliminating the estimated reduction in capacity corresponding to leakage current. After updating the estimated capacity of the selected battery backup unit using the partial discharge capacity check of method 10, act 304 and act 306 can be repeated to see if sufficient total estimated capacity of the battery backup units other than the target battery backup unit exists to conduct act 308. If the total estimated capacity of the battery backup units other than the target battery backup unit is still insufficient, the partial discharge capacity check of method 10 can be repeated on one or more of the remaining battery backup units until sufficient total estimated capacity exits to conduct act 308.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including,"

and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A power supply system comprising:
   three power supply units, each of the power supply units comprising a direct current (DC) output connected to an electrical load; and
   three backup battery units, each of the backup battery units being controllable to output DC power to an associated one of the power supply units at a respective controlled rate;
   a control unit configured to:
      selectively cause each of the power supply units to draw a constant DC power from the associated backup battery unit during a respective period of time to partially discharge the associated backup battery unit, generate a respective varying DC power from a combination of the constant DC power from the associated backup battery unit and a respective varying AC power from a power source and supply the respective varying DC power to the electrical load; and
      estimate a respective total capacity of each of the backup battery units based on a total energy discharged by the respective backup battery unit during the respective period of time and output voltage of the respective backup battery unit during the respective period of time.

2. The power supply system of claim 1, wherein the total energy discharged by each of the backup battery units during the respective period of time is less than 50% of the respective estimated total capacity of the backup battery unit.

3. The power supply system of claim 2, wherein the total energy discharged by each of the backup battery units during the respective period of time is less than 25% of the respective estimated total capacity of the backup battery unit.

4. The power supply system of claim 1, wherein the control unit is further configured to:
   compare, for each of the backup battery units, the estimated total capacity of the backup battery unit with a minimum required total capacity for the backup battery unit; and
   generate, for one of the backup battery units, an output indicating that the backup battery unit lacks adequate total capacity in response to the estimated total capacity of the backup battery unit being less than the minimum required total capacity for the backup battery unit.

5. The power supply system of claim 1, wherein the control unit is further configured to:
   determine a total estimated capacity for all of the backup battery units excluding a designated one of the backup battery units;
   determine if the total estimated capacity for all of the backup battery units excluding the designated one of the backup battery units exceeds a minimum required capacity for conducting a capacity gage calibrating full discharge cycle of the designated one of the backup battery units; and
   in response to the total estimated capacity for all of the backup battery units excluding the designated one of the backup battery units exceeding the minimum required capacity for conducting the capacity gage calibrating full discharge cycle of the designated one of the backup battery units, control operation of the power supply unit associated with the designated one of the backup battery units to:
      charge the designated one of the backup battery units to a full charge level;
      discharge the designated one of the backup battery units from the full charge level to an empty charge level;
      determine an amount of energy discharged by the designated one of the backup battery units during the discharge from the full charge level to the empty charge level;
      charge the designated one of the backup battery units from the empty charge level to the full charge level; and
      calibrate a capacity gage of the designated one of the backup battery units based on the amount of energy discharged during the discharge from the full charge level to the empty charge level.

6. A power supply system comprising:
   a backup battery unit;
   a power supply unit comprising a direct current (DC) output connected to an electrical load; and
   a control unit configured to:
      control the power supply unit to draw a controlled DC power from the backup battery unit during a period of time to partially discharge the backup battery unit generate a varying DC power from a combination of the controlled DC power from the backup battery unit and a varying alternating current (AC) power from an AC power source and supply the varying DC power to the electrical load; and estimate a total capacity of the backup battery unit as a function of total energy discharged by the backup battery unit during the period of time and an output voltage of the backup battery unit during the period of time.

7. The power supply system of claim 6, wherein the control unit is configured to terminate discharging of the backup battery unit when the output voltage of the backup battery unit drops to a predetermined voltage that is greater than a minimum useable voltage of the backup battery unit.

8. The power supply system of claim 6, wherein the period of time is a predetermined amount of time.

9. The power supply system of claim 6, wherein the total energy discharged by the backup battery unit during the period of time is less than 50% of the estimated total capacity of the backup battery unit.

10. The power supply system of claim 9, wherein the total energy discharged by the backup battery unit during the period of time is less than 25% of the estimated total capacity of the backup battery unit.

11. The power supply system of claim 6, wherein the control unit is further configured to:

compare the estimated total capacity of the backup battery unit with a minimum required total capacity for the backup battery unit; and generate an output indicating that the backup battery unit lacks adequate total capacity in response to the estimated total capacity of the backup battery unit being less than the minimum required total capacity for the backup battery unit.

12. The power supply system of claim 6, further comprising:

a second backup battery unit; and a second power supply unit comprising a second DC output connected to the electrical load, and wherein the control unit is further configured to:

selectively cause the second power supply unit to draw a second constant DC power from the second backup battery unit during a second period of time to partially discharge the second backup battery unit generate a second varying DC power from a combination of the second constant DC power from the second backup battery unit and a second varying AC power from the AC power source and supply the second varying DC power to the electrical load, the second period of time not overlapping the period of time; and estimate a total capacity of the second backup battery unit based on a total energy discharged by the second backup battery unit during the second period of time and an output voltage of the second backup battery unit during the second period of time.

13. The power supply system of claim 12, further comprising:

a third backup battery unit; and a third power supply unit, and wherein the control unit is further configured to:

determine a combined estimated capacity that includes the estimated total capacity of the first backup battery unit and the estimated total capacity of the second backup battery unit; and in response to determining that the combined estimated capacity exceeds a minimum required capacity for conducting a capacity gage calibrating full discharge cycle of the third backup battery unit, control operation of the third power supply assembly to:

charge the third backup battery unit to a full charge level;

discharge the third backup battery unit from the full charge level to an empty charge level;

determine an amount of energy discharged by the third backup battery unit during the discharge from the full charge level to the empty charge level;

charge the third backup battery unit from the empty charge level to the full charge level; and calibrate a capacity gage of the third backup battery unit based on the amount of energy discharged by the third backup battery unit during the discharge from the full charge level to the empty charge level.

14. A method comprising:

controlling a power supply unit to:

draw an amount of electrical energy from a battery over a period of time to partially discharge the battery at a controlled discharge rate, output a varying direct current (DC) power to a load; and generate the varying DC power output to the load by the power supply unit from a combination of the amount of energy drawn from the battery over the period of time and a varying alternating current (AC) power from an AC power source;

measuring an output voltage of the battery during the period of time; and estimating a total capacity of the battery as a function of the amount of electrical energy and the output voltage.

15. The method of claim 14, wherein the controlled discharge rate is constant.

16. The method of claim 15, wherein the discharging of the battery is terminated when the output voltage of the battery drops to a predetermined voltage that is greater than a minimum useable voltage of the battery.

17. The method of claim 14, wherein the period of time is a predetermined amount of time.

18. The method of claim 14, wherein the amount of energy discharged by the battery is less than 50% of the estimated total capacity of the battery.

19. The method of claim 14, wherein estimating the total capacity of the battery as a function of the amount of energy and the output voltage comprises:

reading one or more total capacity estimate values from a data lookup table corresponding to the amount of energy and the output voltage; and determining the estimate of the total capacity of the battery based on the one or more total capacity estimate values read from the data lookup table.

* * * * *